United States Patent
Itaya et al.

(10) Patent No.: US 9,607,647 B2
(45) Date of Patent: Mar. 28, 2017

(54) MAGNETIC-DISK GLASS SUBSTRATE AND MAGNETIC DISK

(71) Applicant: HOYA CORPORATION, Tokyo (JP)

(72) Inventors: Masanobu Itaya, Minami-Alps (JP); Kinobu Osakabe, Tokorozawa (JP)

(73) Assignee: HOYA CORPORATION, Tokyo (JP)

( * ) Notice: Subject to any disclaimer, the term of this patent is extended or adjusted under 35 U.S.C. 154(b) by 0 days.

(21) Appl. No.: 14/432,184

(22) PCT Filed: Sep. 30, 2013

(86) PCT No.: PCT/JP2013/076616
§ 371 (c)(1),
(2) Date: Mar. 27, 2015

(87) PCT Pub. No.: WO2014/051153
PCT Pub. Date: Apr. 3, 2014

(65) Prior Publication Data
US 2015/0248910 A1    Sep. 3, 2015

Related U.S. Application Data

(60) Provisional application No. 61/707,011, filed on Sep. 28, 2012.

(51) Int. Cl.
*G11B 5/73*    (2006.01)

(52) U.S. Cl.
CPC .............. *G11B 5/7315* (2013.01); *G11B 5/73* (2013.01)

(58) Field of Classification Search
None
See application file for complete search history.

(56) References Cited

U.S. PATENT DOCUMENTS

| | | | | |
|---|---|---|---|---|
| 2005/0238927 A1* | 10/2005 | Horie | ...... | B24B 21/04 428/846.9 |
| 2008/0291578 A1* | 11/2008 | Ono | ...... | C03C 17/34 360/313 |
| 2009/0148725 A1* | 6/2009 | Minazawa | ...... | G11B 5/7315 428/848 |
| 2011/0277508 A1* | 11/2011 | Osawa | ...... | C03B 7/10 65/97 |
| 2015/0213826 A1* | 7/2015 | Itaya | ...... | G11B 5/82 428/846.9 |

FOREIGN PATENT DOCUMENTS

| | | |
|---|---|---|
| JP | 2009-140584 A | 12/2007 |
| JP | 2008-293552 A | 12/2008 |
| JP | 2012-101319 A | 5/2012 |
| JP | 2012-142071 A | 7/2012 |

OTHER PUBLICATIONS

International Search Report in PCT/JP2013/076616 dated Oct. 29, 2013.

* cited by examiner

*Primary Examiner* — Kevin Bernatz
(74) *Attorney, Agent, or Firm* — Global IP Counselors, LLP

(57) ABSTRACT

A magnetic-disk glass substrate of the present invention has a pair of main surfaces, and an arithmetic mean roughness (Ra) for wavelength components of 10 to 50 nm of the surface of the main surfaces is 0.15 nm or less.

10 Claims, 3 Drawing Sheets

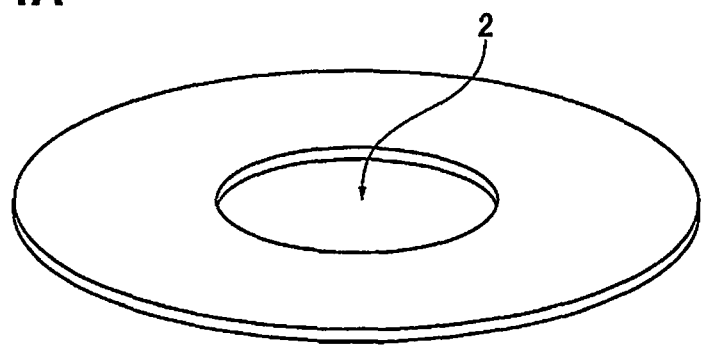
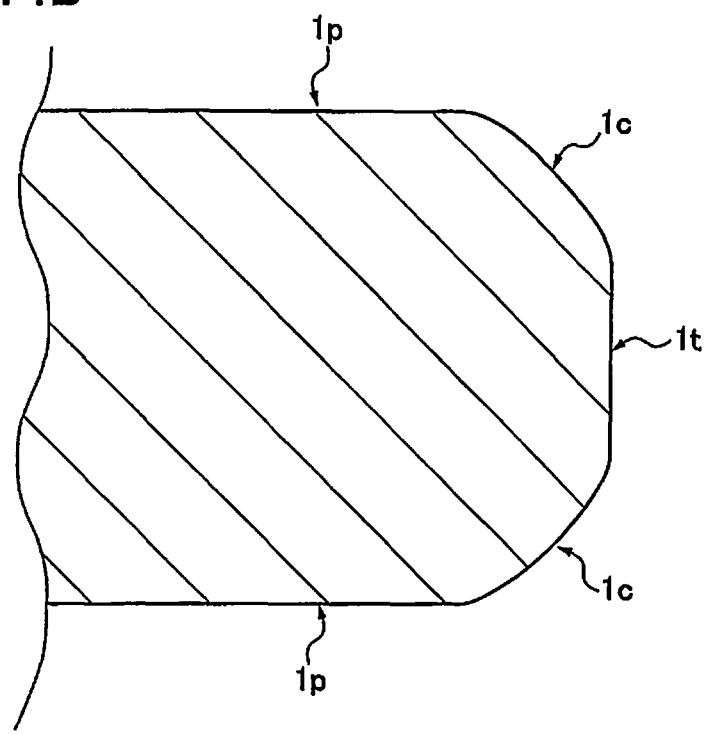

MAGNETIC-DISK GLASS SUBSTRATE AND MAGNETIC DISK

CROSS-REFERENCE TO RELATED APPLICATIONS

This U.S. National stage application claims priority under 35 U.S.C. §119(e) to U.S. Provisional Patent Application No. 61/707,011, filed on Sep. 28, 2012, the entire contents of U.S. Provisional Patent Application No. 61/707,011 are hereby incorporated herein by reference.

BACKGROUND

Field of the Invention

The present invention relates to a magnetic-disk glass substrate and a magnetic disk.

Background Information

Nowadays, personal computers, digital versatile disc (DVD) recorders, and the like have a built-in hard disk drive (HDD) for data recording. In particular, a magnetic disk in which a magnetic recording layer is provided on a glass substrate is used in a hard disk drive that is used in a device premised on portability, such as a notebook-type personal computer, and magnetic recording information is recorded on or read from the magnetic recording layer with a magnetic head that flies slightly above the surface of the magnetic disk. A glass substrate is unlikely to be plastically deformed compared with a metal substrate (aluminum substrate) and the like, and thus is preferably used as a substrate of the magnetic disk.

Moreover, the density of magnetic recording has been increased to meet the demand for an increase in the storage capacity of hard disk drives. For example, the magnetic recording information area (recording bit) has been made smaller using a perpendicular magnetic recording system that causes the direction of magnetization in the magnetic recording layer to be perpendicular to the surface of the substrate. A magnetic disk of the perpendicular magnetic recording system is obtained by forming an adherent layer, a soft magnetic layer (soft under layer: SUL), a base layer, a magnetic recording layer, a protecting layer, a lubricant layer, and the like in this order on a metal substrate or a glass substrate, for example. Employing the perpendicular magnetic recording system makes it possible to increase the storage capacity per disk substrate. Also, in order to further increase the storage capacity, the distance between the recording and reproducing element portion and the magnetic recording layer is made extremely short by causing the element portion of the magnetic head to project farther, thus further improving the accuracy of the recording and reproducing of information (improve the S/N ratio). It should be noted that such control of the recording and reproducing element portion of the magnetic head is called a dynamic flying height (DFH) control mechanism and a magnetic head equipped with this control mechanism is called a DFH head. A magnetic-disk glass substrate that is used in an HDD in combination with such a DFH head is produced such that the surface unevenness of the substrate is extremely small, in order to prevent the substrate from colliding or coming into contact with the magnetic head and the recording and reproducing element portion that projects farther therefrom.

On the other hand, it is known that the surface shape of a magnetic-disk glass substrate affects the crystalline orientation dispersion ($\Delta\theta 50$; deviation of crystals from the perpendicular direction) of a specific crystal plane, such as a Co (002) face or an Ru (002) face, of magnetic particles in the magnetic recording layer formed on the substrate. $\Delta\theta 50$ is calculated as a half-value width of a peak in the case where $\theta/2\theta$ is measured with an X-ray diffractometer, a $2\theta$ value is measured from the peak top of the crystal plane of the magnetic recording layer and a $\theta$ scan is performed while fixing the $2\theta$. The crystalline orientation dispersion $\Delta\theta 50$ is an index indicating the dispersion of an axis of easy magnetization, and the smaller this value is, the better. By improving the $\Delta\theta 50$ (i.e., by bringing the $\Delta\theta 50$ close to zero), it is possible to obtain excellent magnetic properties and to improve the signal-to-noise ratio (SNR), and therefore, it is possible to further increase the recording density.

Regarding the crystalline orientation dispersion ($\Delta\theta 50$), JP 2009-140584A describes a magnetic-disk glass substrate that is prepared not based on a surface roughness Ra but so as to have a root mean square value of inclination angles that is smaller than or equal to a predetermined value (for example, 5 degrees or less, and more preferably 3 degrees or less) in order to improve the crystalline orientation dispersion ($\Delta\theta 50$) and the SNR of the magnetic recording layer.

Moreover, J P 2008-293552A describes a magnetic-disk glass substrate in which the surface roughness Ra satisfies the relationship Ra≤0.15 nm and the average inclination angle is set to be 2 degrees or less. Using this substrate makes it possible to reduce $\Delta\theta 50$ and to reduce the medium noise (evaluated at a linear recording density of 825 kbpi using a TMR head of 130 Gbpsi). It should be noted that in the case where the linear recording density is 825 kbpi, a recording bit length (hereinafter, indicates a calculated value based on linear recording density) is about 30 nm.

SUMMARY

In recent years, the amount of projection of the recording and reproducing element portion of the magnetic head has been increased in order to achieve a high recording density of, for example, 600 GB/P or greater in a 2.5-inch magnetic disk, and thus the gap between the element portion and the magnetic disk becomes extremely small. As a result, writing is possible at a higher recording density than before. It is thought that magnetic disks will be made to have even higher recording densities in future, and that improving the SNR of reproduced signals from a magnetic disk having a high recording density will become an even more important factor.

Therefore, it is an object of the present invention to provide a magnetic-disk glass substrate and a magnetic disk with which the SNR of reproduced signals from a magnetic disk having a higher recording density than before can be improved.

The inventors of the present invention found that, out of the components (wavelength components) of a shape wavelength (period of unevenness) of surface roughness on a main surface of a magnetic-disk glass substrate, the wavelength components within a specific range significantly affect the orientation of the crystal plane of magnetic particles.

That is, in the case where the shape wavelength of the main surface is sufficiently short relative to the particle diameter of the magnetic particles, the shape wavelength of an amorphous metal layer formed on the main surface, such as an adherent layer (e.g., CrTi) or an SUL (e.g., FeCoTaZr), also becomes sufficiently short. In this case, the magnetic particles are arranged without following the short unevenness of the shape wavelength of the amorphous metal layer, and thus it is thought that the orientation of the crystal plane of the magnetic particles is less adversely affected. On the other hand, in the case where the shape wavelength of the main surface is sufficiently long relative to the particle diameter of the magnetic particles, the shape wavelength of an amorphous metal layer formed on the main surface, such as an adherent layer (e.g., CrTi) or an SUL (e.g., FeCoTaZr), also becomes sufficiently long, and therefore, inclinations on the surface of the amorphous metal layer becomes moderate. In this case, the magnetic particles are arranged following the surface of the amorphous metal layer, but because the inclinations on the surface of the amorphous metal layer are moderate, it is thought that the orientation of the crystal plane of the magnetic particles is less adversely affected.

Accordingly, the inventors of the present invention inferred that in the case where the shape wavelength of the main surface of the magnetic-disk glass substrate is a value within a specific range relative to the particle diameter of the magnetic particles, the orientation of the crystal plane of the magnetic particles arranged on the surface of the amorphous metal layer is significantly affected, thus allowing the present invention to be achieved.

From the above-described viewpoint, regarding a main surface of a magnetic-disk glass substrate, the inventors of the present invention determined a correlation between surface roughness for different wavelength components and the crystalline orientation dispersion $\Delta\theta 50$ of the magnetic particles arranged above the main surface, and identified wavelength components that significantly affected the orientation of the crystal plane of the magnetic particles based on the correlation. It was found that setting the value of the surface roughness for the identified wavelength components to less than or equal to a predetermined value makes it possible to bring the crystalline orientation dispersion $\Delta\theta 50$ of the magnetic particles close to zero and to improve the SNR of reproduced signals from the magnetic disk, thus allowing the present invention to be achieved.

A first aspect of the present invention is a magnetic-disk glass substrate including a pair of main surfaces, wherein an arithmetic mean roughness (Ra) for wavelength components of 10 to 50 nm of a surface of the main surfaces is 0.15 nm or less.

A second aspect of the present invention is a magnetic-disk glass substrate including a pair of main surfaces, wherein the arithmetic mean roughness (Ra) for wavelength components of 10 to 30 nm of the surface of the main surfaces is 0.10 nm or less.

A third aspect of the present invention is a magnetic-disk glass substrate including a pair of main surfaces, wherein the arithmetic mean roughness (Ra) for wavelength components of 10 to 20 nm of the surface of the main surfaces is 0.10 nm or less.

In the above-described magnetic-disk glass substrate, the arithmetic mean roughness (Ra) of the surface of the main surfaces is 0.15 nm or less when an area of 1 μm square is divided into sections of 512 by 512 and each section is measured using an atomic force microscope.

In the above-described magnetic-disk glass substrate, processing in a circumferential direction is not performed on the main surfaces.

In the above-described magnetic-disk glass substrate, in a case where samples of inclinations on the main surfaces are obtained at intervals of 10 nm, a mean square value of the inclinations is 0.0025 or less and a frequency at which square value of the inclinations is 0.004 or more is 15% or less.

A fourth aspect of the present invention is a magnetic disk in which at least a magnetic recording layer is formed on a surface of the above-described magnetic-disk glass substrate.

A fifth aspect of the present invention is a magnetic-disk glass substrate including a pair of flat main surfaces, wherein, after a magnetic recording layer is formed above the main surfaces to produce a magnetic disk, wavelength components for which an arithmetic mean roughness (Ra) of a surface of the main surfaces is 0.15 nm or less are determined such that a favorable signal-to-noise ratio of reproduced signals is obtained when signals are written in the magnetic recording layer at a linear recording density of 2000 kbpi or greater. Furthermore, it is more preferable that wavelength components for which an arithmetic mean roughness (Ra) is 0.10 nm or less is determined.

With a magnetic-disk glass substrate and a magnetic disk according to the present invention, it is possible to improve the SNR of reproduced signals from a magnetic disk having a high recording density.

BRIEF DESCRIPTION OF THE DRAWINGS

FIG. 1A is a drawing illustrating an external shape of a magnetic-disk glass substrate according to an embodiment;

FIG. 1B is an enlarged cross-sectional view of an end portion on the outer circumferential side of the magnetic-disk glass substrate according to the embodiment;

DESCRIPTION OF EMBODIMENTS

Figure 2:
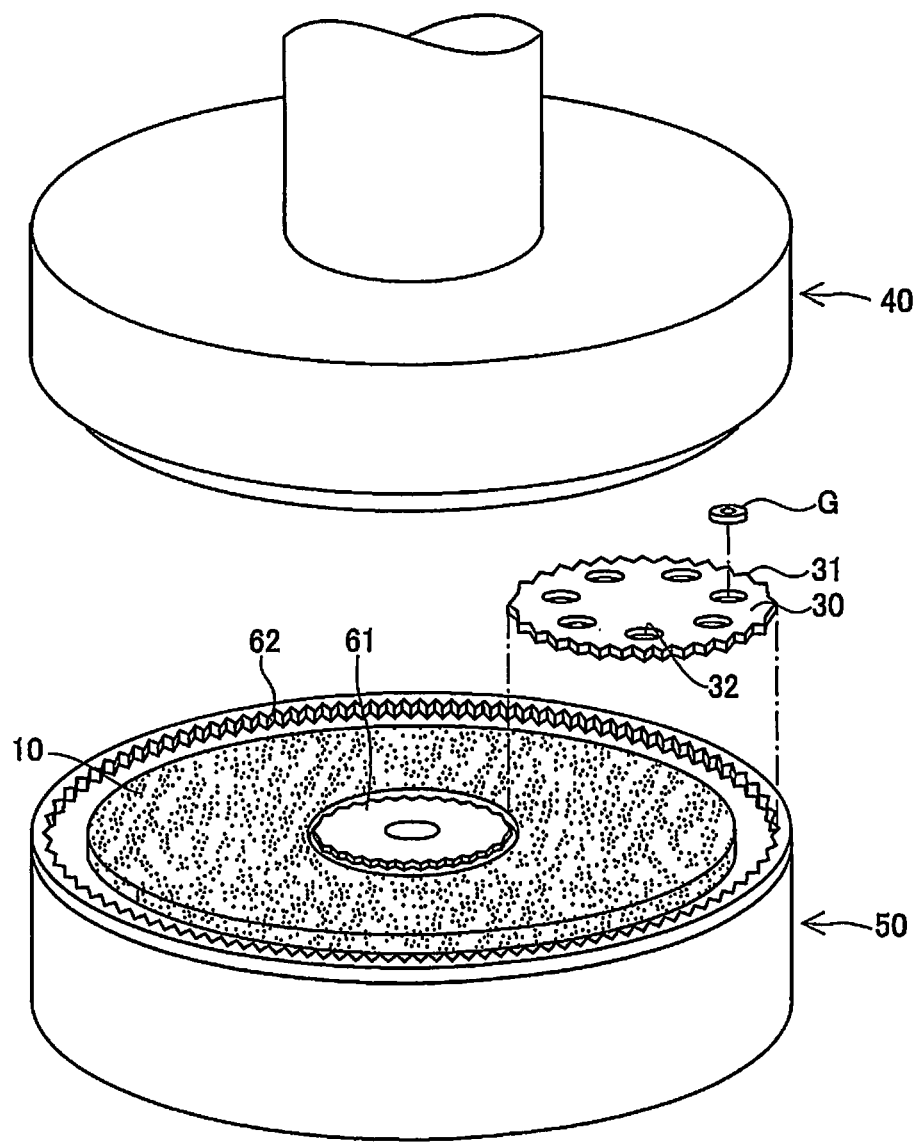
FIG. 2 is an exploded perspective view of a polishing device (double-side polishing device) used in a first polishing step.

Hereinafter, wavelength components within a specific range on the main surface of the magnetic-disk glass substrate is referred to as "wavelength band".

The inventors of the present invention produced various glass substrates and magnetic disks, and examined the relationships between roughnesses for various wavelength bands on the surfaces of the glass substrates and the SNRs of reproduced signals from the magnetic disks using an AFM. It should be noted that the examination was performed only in the case where each surface roughness Ra (surface roughness for all of the wavelength bands: referred to as "Ra1") was 0.15 nm or less when an area of 1 μm square was measured with a resolution of 512 by 512. This is because Ra1 of more than 0.15 nm was correlated with the SNR, whereas Ra1 of 0.15 nm or less was not correlated with the SNR.

In order to examine a wavelength band that is correlated with the SNR, the examination was performed by gradually reducing the upper limit of the wavelength band. This is because it was thought that a wavelength band was not correlated with the SNR in the case where the wavelength band included wavelength components longer than the size of the magnetic particles. It should be noted that the minimum wavelength is about 4 nm (referred to simply as "4 nm" hereinafter) because the minimum wavelength is twice as long as the minimum measurement resolution (1000/512 (nm)). First, as a result of an examination for a wavelength band of 100 nm or less (4 to 100 nm), there was no correlation with the SNR. Next, as a result of an examination of Ra for a wavelength band of 50 nm or less (4 to 50 nm), there was no correlation with the SNR, but the correlation coefficient was higher than that of the case where the wavelength band was 100 nm or less. Therefore, on the contrary, Ra for a wavelength band of 10 nm or less (4 to 10 nm) was examined, and it was revealed that there was absolutely no correlation with the SNR. As a result of these preliminary examinations, it was inferred that the roughness of a glass substrate in the wavelength band of 10 nm or less was a factor that deteriorated the correlation with the SNR.

Therefore, it was after having excluded the wavelength band of 10 nm or less and examined Ra for a wavelength band of 10 to 50 nm that a favorable correlation with the SNR was obtained for the first time. It was found that Ra for a wavelength band of 10 to 30 nm was highly correlated with the SNR, and Ra for a wavelength band of 10 to 20 nm was more highly correlated with the SNR. Correlation between Ra for a wavelength band of 10 to 40 nm and the SNR was similar to that between Ra for a wavelength band of 10 to 50 nm and the SNR.

It should be noted that an arithmetic mean roughness Ra for wavelength components of the main surface can be calculated as follows. First, using an atomic force microscope (AFM), three-dimensional data of surface properties of an area having a predetermined size on the main surface of the magnetic-disk glass substrate is measured at minimum constant intervals (for example, for sections of 512 by 512 into which an area of 1 μm square is divided). Two-dimensional Fourier transformation is performed on the measured three-dimensional data to provide a two-dimensional image. A desired wavelength component is extracted from the provided two-dimensional image (that is, band-pass filter processing is performed). Inverse Fourier transformation is performed on the two-dimensional image of the extracted desired wavelength component to produce three-dimensional data (three-dimensional data including only the desired wavelength component), and an arithmetic mean roughness Ra is calculated from this three-dimensional data.

In view of the above-described findings, regarding the main surface of the magnetic-disk glass substrate according to this embodiment, it is preferable that an arithmetic mean roughness Ra for wavelength components of 10 to 50 nm is 0.15 nm or less, it is more preferable that an arithmetic mean roughness Ra for wavelength components of 10 to 30 nm is 0.10 nm or less, and it is even more preferable that an arithmetic mean roughness Ra for wavelength components of 10 to 20 nm is 0.10 nm or less.

It should be noted that it is preferable to configure the main surface of the magnetic-disk glass substrate such that an arithmetic mean roughness (Ra) for all of the wavelength bands is 0.15 nm or less as described above.

Hereinafter, a method for manufacturing a magnetic-glass substrate of this embodiment will be described in detail.

[Magnetic-Disk Glass Substrate]

Aluminosilicate glass, soda-lime glass, borosilicate glass, or the like can be used as a material for the magnetic-disk glass substrate of this embodiment. In particular, aluminosilicate glass can be preferably used in that it can be chemically strengthened and a magnetic-disk glass substrate having excellent flatness of its main surface and excellent strength of the substrate can be produced. It is more preferable to use amorphous aluminosilicate glass.

Although there is no limitation on the composition of the magnetic-disk glass substrate of this embodiment, the glass substrate of this embodiment is amorphous aluminosilicate glass that preferably contains, in terms of oxide amount in mol %, $SiO_2$ in an amount of 50 to 75%, $Al_2O_3$ in an amount of 1 to 15%, at least one component selected from $Li_2O$, $Na_2O$ and $K_2O$ in a total amount of 5 to 35%, at least one component selected from MgO, CaO, SrO, BaO and ZnO in a total amount of 0 to 20%, and at least one component selected from $ZrO_2$, $TiO_2$, $La_2O_3$, $Y_2O_3$, $Ta_2O_5$, $Nb_2O_5$ and $HfO_2$ in a total amount of 0 to 10%. This composition is referred to as "glass composition 1" hereinafter.

The glass substrate of this embodiment may also be amorphous aluminosilicate glass that preferably contains, in mass %, $SiO_2$ in an amount of 57 to 75%, $Al_2O_3$ in an amount of 5 to 20% (it should be noted that the total amount of $SiO_2$ and $Al_2O_3$ is 74% or more), $ZrO_2$, $HfO_2$, $Nb_2O_5$, $Ta_2O_5$, $La_2O_3$, $Y_2O_3$ and $TiO_2$ in a total amount of more than 0% to 6% or less, $Li_2O$ in an amount of more than 1% to 9% or less, $Na_2O$ in an amount of 5 to 18% (it should be noted that a mass ratio $Li_2O/Na_2O$ is 0.5 or less), $K_2O$ in an amount of 0 to 6%, MgO in an amount of 0 to 4%, CaO in an amount of more than 0% to 5% or less (it should be noted that the total amount of MgO and CaO is 5% or less and the content of CaO is larger than that of MgO), and SrO+BaO in an amount of 0 to 3%.

Also, the glass substrate of this embodiment may contain, in terms of oxide amount in mass %, $SiO_2$: 45.60 to 60%, $Al_2O_3$: 7 to 20%, $B_2O_3$: 1.00 to less than 8%, $P_2O_5$: 0.50 to 7%, $TiO_2$: 1 to 15%, and the total amount of RO (it should be noted that R represents Zn and Mg): 5 to 35%. In this composition, it is also preferable to use glass that further contains CaO in an amount of 3.00% or less, BaO in an amount of 4% or less, no PbO, no $As_2O_3$, no $Sb_2O_3$, no $Cl^-$ component, no $NO^-$ component, no $SO^{3-}$ component, and no $F^-$ component (second glass composition). By performing crystallization processing on such glass, crystallized glass can be obtained that contains one or more selected from $RAl_2O_4$ and $R_2TiO_4$ (it should be noted that R represents one or more selected from Zn and Mg) as a main crystal phase and in which the particle size of crystals in the main crystal phase is within a range of 0.5 nm to 20 nm, the degree of crystallization is 15% or less, and the specific gravity is 2.95 or less. This composition is referred to as "glass composition 3".

The composition of the magnetic-disk glass substrate of this embodiment may include $SiO_2$, $Li_2O$ and $Na_2O$, and one or more alkaline earth metal oxides selected from the group consisting of MgO, CaO, SrO and BaO as essential components, the molar ratio of the content of CaO to the total content of MgO, CaO, SrO and BaO (CaO/(MgO+CaO+SrO+BaO)) may be 0.20 or less, and the glass-transition temperature may be 650° C. or higher. The magnetic-disk glass substrate having such a composition is preferably for a magnetic-disk glass substrate to be used in a magnetic disk for energy-assisted magnetic recording. This composition is referred to as "glass composition 2".

FIG. 1 shows an external shape of the magnetic-disk glass substrate according to the embodiment. As shown in FIG. 1A, a thin glass substrate that has an annular shape with an inner hole 2 formed therein is used as the magnetic-disk glass substrate of this embodiment. Although there is no limitation on the size of the magnetic-disk glass substrate, the magnetic-disk glass substrate is preferable, for example, as a magnetic-disk glass substrate having a nominal diameter of 2.5 inches.

FIG. 1B is an enlarged cross-sectional view of an end portion on the outer circumferential side of the magnetic-disk glass substrate according to the embodiment. As shown in FIG. 1B, the magnetic-disk glass substrate has a pair of main surfaces 1p, a side wall surface 1t that is disposed in a direction orthogonal to the pair of main surfaces 1p, and a pair of chamfered surfaces 1c that are disposed between the pair of main surfaces 1p and the side wall surface 1t. A side wall surface and chamfered surfaces, which are not shown in the drawing, are also formed in the end portion on the inner circumferential side of the magnetic-disk glass substrate. It should be noted that processing for forming a texture in the circumferential direction is not performed on the main surfaces of the magnetic-disk glass substrate of this embodiment.

It should be noted that it is preferable to use amorphous glass in the magnetic-disk glass substrate of this embodiment as described above because it becomes possible to smooth the main surfaces with high accuracy and to easily reduce the frequency of inclinations having a large angle on the main surfaces. Moreover, by chemically strengthening the above-described amorphous glass, it is possible to form a compressive stress layer on the surface layer and to enhance the impact resistance of the magnetic-disk glass substrate.

Crystallized glass (crystal glass) may be used for the magnetic-disk glass substrate of this embodiment. Using crystallized glass makes it possible to enhance the hardness of the glass substrate and to enhance the impact resistance thereof.

Heat-resistant glass having a Tg of 650° C. may also be used in the glass substrate of this embodiment. In this case, it is possible to form a magnetic film for an energy-assisted magnetic recording system, and thus to achieve an even higher recording density.

In the case where samples of inclinations are obtained on a main surface of the magnetic-disk glass substrate of this embodiment at intervals of about 10 nm, it is preferable that the mean square value of the inclinations is 0.0025 or less and that the frequency at which the square value of the inclinations is 0.004 or more is 15% or less. It is more preferable that the frequency at which the square value of the inclinations is 0.004 or more is 10% or less. By forming the main surface to have such a shape, the number of the portions in which large inclinations are formed on the main surface is extremely reduced. Therefore, it is possible to prevent problems in that the crystalline orientation in the magnetic recording layer formed on the magnetic-disk glass substrate is largely inclined from the perpendicular direction with respect to the main surface or crystals do not grow appropriately. Moreover, a recording bit length becomes very short in a magnetic disk having a high recording density. However, even in this case, the SNR of reproduced signals from the magnetic disk is improved.

A method for measuring inclinations on the main surface of the magnetic-disk glass substrate (referred to merely as "substrate" as appropriate hereinafter) will be described. Inclinations on the main surface are measured using an atomic force microscope (AFM). Data observed with an AFM is data of a height Z(x,y) at positions arranged at the equal intervals in a measurement plane (x-y plane) of the substrate.

For example, the height Z(x,y) at respective positions that divide both the x direction and the y direction of a measurement region of 1 μm square on the main surface of the substrate into 512 is measured, and the root mean square inclination Sdq is calculated based on the values of Z(x,y) at the sampling positions at intervals of about 10 nm (more precisely 9.76 nm) in accordance with the following equation 1. The "mean square value of the inclinations" described above is a square of the root mean square inclination Sdq.

[Equation 1]

$$Sdq = \sqrt{\frac{1}{A}\iint_A\left[\left(\frac{\partial Z(x,y)}{\partial x}\right)^2 + \left(\frac{\partial Z(x,y)}{\partial y}\right)^2\right]dxdy} \quad \text{(Equation 1)}$$

On the other hand, the inclination dq on the main surface at a minute gap (about 10 nm) between the neighboring sampling positions is represented by the following equation 2. The "square of the inclination" described above is a square of the inclination dq.

[Equation 2]

$$dq = \sqrt{\left[\left(\frac{\partial Z(x,y)}{\partial x}\right)^2 + \left(\frac{\partial Z(x,y)}{\partial y}\right)^2\right]} \quad \text{(Equation 2)}$$

It should be noted that it is preferable that the distance between the neighboring sampling positions is close to the recording bit length of a magnetic disk having a high recording density. Measuring inclinations at resolution close to the recording bit length makes it easy to correlate a measurement value with the crystalline orientation of the magnetic particles included in one recording bit of a magnetic recording layer, and in turn, with the SNR of reproduced signals. For example, it is preferable that the length of the gap between the sampling positions is set to be about half to twice as long as the recording bit length to be assumed (for example, about 12.70 nm or less at a recording density of 2000 kbpi or greater).

The "frequency at which the square value of the inclinations is 0.004 or more is 15% or less" described above means that the ratio (or proportion) of the number of samples in which the square value of the inclinations is 0.004 or more to the number of samples for the square value of the inclinations obtained in the main surface is 15% or less.

[Method for Manufacturing Magnetic-Disk Glass Substrate]

Hereinafter, a method for manufacturing a magnetic-disk glass substrate of this embodiment will be described for each step. It should be noted that the order of the steps may be changed as appropriate.

(1) Raw Glass Plate Molding and Rough Grinding Step

After forming a sheet of plate glass by, for example, a float method, a raw glass plate having a predetermined shape from which a magnetic-disk glass substrate is to be made is cut out from this sheet of plate glass. A raw glass plate may also be molded by, for example, pressing using an upper mold and a lower mold instead of a float method. It should be noted that a method for manufacturing a raw glass plate is not limited to these methods and a raw glass plate can also be manufactured by a known manufacturing method such as a down draw method, a redraw method or a fusion method.

It should be noted that rough grinding processing using loose abrasive particles may be performed on the two main surfaces of the raw glass plate as needed.

(2) Circular Hole Forming Step

A circular hole is formed in the center of the raw glass plate using a cylindrical diamond drill, and thus an annular raw glass plate is obtained. It should be noted that a circular hole may be formed by forming a circular cutting line on the surface of the raw glass plate using a diamond cutter or the like and by cutting the raw glass plate along the cutting line.

(3) Chamfering Step

After the circular hole forming step, a chamfering step of forming chamfered surfaces at the end portions (outer circumferential end portion and inner circumferential end portion) is performed. In the chamfering step, chamfering is performed on the outer circumferential end portion and the inner circumferential end portion of the annular raw glass plate with a metal-bonded grindstone using diamond abrasive particles, or the like, and thus the chamfered surfaces are formed.

(4) End Surface Polishing Step

Next, end surface polishing is performed on the annular raw glass plate.

In the end surface polishing, the side wall surface (end surface) on the inner circumference side of the raw glass plate and the side wall surface (end surface) on the outer circumference side thereof are given a mirror finish by performing brushing. In this case, a slurry containing microparticles of cerium oxide or the like as loose abrasive particles is used. By polishing the end surfaces, contamination by attached waste and the like, and damage or impairment such as scratches on the side wall surfaces of the raw glass plate are eliminated, and therefore, it is possible to prevent thermal asperity and the deposition of ions such as sodium and potassium that causes corrosion.

(5) Precision Grinding Step

In a precision grinding step, the main surfaces of the annular raw glass plate are ground using a double-side grinding device provided with a planetary gear mechanism. The double-side grinding device has a pair of upper and lower surface plates (upper surface plate and lower surface plate) and the annular raw glass plate is held between the upper surface plate and the lower surface plate. The raw glass plate and the surface plates are moved relative to each other by moving one or both of the upper surface plate and the lower surface plate while supplying a coolant between the raw glass plate and the surface plates, so that two main surfaces of the raw glass plate can be ground. It should be noted that it is preferable that a grindstone having fixed abrasive particles obtained by fixing abrasive particles made of diamond or the like using a resin is mounted on the surfaces of the surface plates.

(6) First Polishing (Main Surface Polishing) Step

Next, first polishing is performed on the ground main surfaces of the raw glass plate. For example, cerium oxide abrasive particles or zirconia abrasive particles that are suspended in a slurry are used as the loose abrasive particles for the first polishing.

Figure 3:
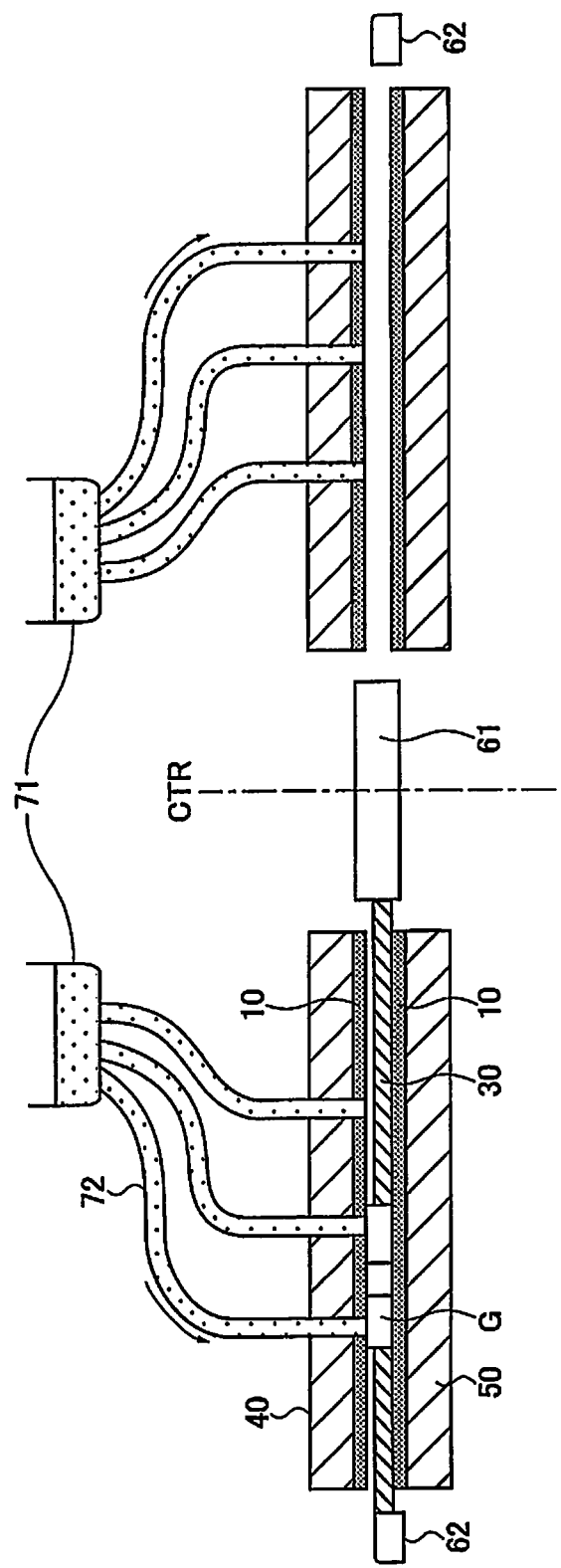
FIG. 3 is a cross-sectional view of the polishing device (double-side polishing device) used in the first polishing step.

A polishing device used in the first polishing step will be described with reference to FIGS. 2 and 3. FIG. 2 is an exploded perspective view of the polishing device (double-side polishing device) used in the first polishing step. FIG. 3 is a cross-sectional view of the polishing device (double-side polishing device) used in the first polishing step. It should be noted that a configuration similar to this polishing device can also be applied in the grinding device used in the grinding step described above.

As shown in FIG. 2, the polishing device has a pair of upper and lower surface plates, that is, an upper surface plate 40 and a lower surface plate 50. An annular raw glass plate G is held between the upper surface plate 40 and the lower surface plate 50, and the raw glass plate G and the surface plates are moved relative to each other by moving one or both of the upper surface plate 40 and the lower surface plate 50, so that the two main surfaces of the raw glass plate G can be polished.

The configuration of the polishing device will be more specifically described with reference to FIGS. 2 and 3.

In the polishing device, planar polishing pads 10 having an annular shape as a whole are attached to the upper surface of the lower surface plate 50 and the bottom surface of the upper surface plate 40. A carrier 30 has a toothing 31 that is provided on its outer circumferential portion and is meshed with a sun gear 61 and an inner gear 62, and one or more hole portions 32 for accommodating and holding the raw glass plate G. The sun gear 61, the inner gear 62 provided on the outer edge and the disc-shaped carrier 30 constitute, as a whole, a planetary gear mechanism that has a central axis CTR as the center. The disc-shaped carrier 30 is meshed with the sun gear 61 on the inner circumferential side and with the inner gear 62 on the outer circumferential side, and accommodates and holds one or more raw glass plates G (workpieces). On the lower surface plate 50, the carrier 30 revolves around the sun gear while rotating on its own axis as a planetary gear, and the raw glass plate G and the lower surface plate 50 are moved relative to each other. For example, when the sun gear 61 rotates in a counterclockwise (CCW) direction, the carrier 30 rotates in a clockwise (CW) direction and the inner gear 62 rotates in the CCW direction. As a result, the polishing pad 10 and the raw glass plate G are moved relative to each other. The raw glass plate G and the upper surface plate 40 may be moved relative to each other in the same manner.

During the relative motion described above, the upper surface plate 40 is pressed against the raw glass plate G (that is, in a vertical direction) with a predetermined load, and the polishing pad 10 is pressed against the raw glass plate G. Moreover, a polishing liquid (slurry) is supplied between the raw glass plate G and the polishing pad 10 from a polishing liquid supplying tank 71 via one or more pipes 72 with a pump (not shown). The main surfaces of the raw glass plate G are polished by a polishing material contained in this polishing liquid.

It should be noted, in this polishing device, it is preferable that the load from the upper surface plate 40 that is applied to the raw glass plate G is adjusted in order to set a desired polishing load with respect to the raw glass plate G. The load is preferably 50 g/cm$^2$ or more, more preferably 70 g/cm$^2$ or more, and even more preferably 90 g/cm$^2$ or more, for the purpose of achieving a high polishing speed. Moreover, the polishing load is preferably 180 g/cm$^2$ or less, more preferably 160 g/cm$^2$ or less, and even more preferably 140 g/cm$^2$ or less, for the purpose of reducing scratches and stabilizing quality.

The supplying speed of the polishing liquid during the polishing processing is varied in accordance with the polishing pad 10, the composition and concentration of the polishing liquid and the size of the raw glass plate G, but is preferably 500 to 5000 ml/minute, more preferably 1000 to 4500 ml/minute, and even more preferably 1500 to 4000 ml/minute, for the purpose of enhancing the polishing speed. The rotation speed of the polishing pad 10 is preferably 10 to 50 rpm, more preferably 20 to 40 rpm, and even more preferably 25 to 35 rpm.

In the first polishing step, polishing is performed such that the main surface of the raw glass plate has a roughness (Ra) of 0.5 nm or less and a micro-waviness (MW-Rq) of 0.5 nm or less in terms of the surface unevenness. Here, the micro-waviness can be expressed as an RMS (Rq) value that is calculated as the roughness for a wavelength band of 100 to 500 μm in a main surface, and can be measured with an optical surface shape measurement device, for example.

The roughness of the main surface is expressed as the arithmetic mean roughness Ra defined by JIS B0601: 2001, and can be measured with an atomic force microscope (AFM), for example. Herein, the arithmetic mean roughness Ra measured for sections of 512 by 512 into which a measurement area of 1 μm square is divided.

(7) Chemical Strengthening Step

Next, the raw glass plate on which the first polishing has been performed is chemically strengthened.

For example, a mixed liquid of melts of potassium nitrate and sodium sulfate can be used as a chemical strengthening liquid. The chemical strengthening is performed by immersing the raw glass plate in the chemical strengthening liquid.

(8) Second Polishing Step

Next, final polishing is performed on the raw glass plate that has been chemically strengthened and sufficiently cleaned. In the second polishing step, polishing is performed on the main surfaces of the raw glass plate using the same configuration of a polishing device and polishing method as those described with reference to FIGS. 2 and 3. In this case, a polishing pad with a soft polisher (suede) (for example, polyurethane foam with an Asker C hardness of 60 to 90) as a resin polisher is used. This second polishing step is mirror-polishing processing to finish the main surfaces of the raw glass plate, for example, into smooth mirror surfaces having a surface roughness of 0.15 nm or less in Ra while retaining the flat surfaces obtained in the first polishing step described above. A polishing liquid is used that is obtained by dispersing colloidal silica (average particle diameter (D50): 5 to 50 nm) in water and adding and dissolving a predetermined amount of aluminum sulfate therein. Here, it should be noted that the average particle diameter (D50) denotes a particle diameter at which a cumulative curve reaches 50% when the cumulative curve is determined by setting the entire volume of powder particles in the particle diameter distribution measured by a light scattering method to 100%, and is a value obtained by measuring particle diameters using, for example, a particle diameter/particle size distribution measurement device.

It is preferable that aluminum sulfate is added therein in an amount within a range of 0.001 to 1 mol/L. If the amount is less than this range, there is a possibility that a sufficient addition effect, which will be described later, will not be obtained. If the amount exceeds this range, there is a possibility that polishing abrasive particles of colloidal silica will excessively aggregate to cause minute scratches and to increase the surface roughness.

It is thought that the effects of addition of aluminum sulfate are as follows, although the reasons for these effects are not necessarily clear. That is, the addition of aluminum sulfate makes it possible to slightly enhance the interaction between colloidal silica abrasive particles having a $SiO_2$ composition, between minute glass sludge formed due to polishing or between the silica abrasive particles and the sludge. It is thought that aggregates in which these substances aggregate loosely are formed. As a result, control of the wavelength band of surface roughness is enabled. That is, a polishing effect due to the aggregates can be added to a polishing effect due to the size of one colloidal silica abrasive particle. For example, although glass sludge formed during the polishing step is very minute (particle diameter of 10 nm or less) and causes the deterioration of surface roughness for a wavelength band of 10 nm or less, the effect of suppressing the deterioration of surface roughness for that wavelength band can be obtained by causing the glass sludge to aggregate and promoting the discharge thereof. Moreover, by changing the degree of aggregation of silica abrasive particles, it is possible to control surface roughness for a specific wavelength band. That is, by adjusting the particle diameter of silica abrasive particles and the amount of aluminum sulfate added as appropriate, it is possible to change surface roughness for a desired wavelength band.

Incidentally, it is thought that these interactions are weak and thus easily deformed when load is applied thereto. Therefore, as long as the amount of aluminum sulfate added is not excessive, substantially no scratches are formed on the main surface of the raw glass plate by the aggregates.

It should be noted that for the same reasons as described above, it is possible to reduce the amount of the colloidal silica and glass sludge that remain on the main surface of the raw glass plate after polishing. As a result of making the size of the recent silica abrasive particles extremely small, it is very difficult, in the case where minute abrasive particles and sludge remain on the main surface as is, to remove the abrasive particles and sludge.

It should be noted that the load applied to the raw glass plate during the polishing processing is preferably within a range of 50 to 150 $g/cm^2$. If the load is smaller than this range, a polishing rate may become too small and productivity may be deteriorated, and if the load is larger than this range, minute scratches may be formed on the main surface of the raw glass plate.

Subsequently, a rinsing step is performed using the same double-side polishing device as is. In the rinsing step, for example, water to which an appropriate amount of aluminum sulfate has been added is used as a processing liquid to be supplied between the polishing pad and the raw glass plate. It is preferable that the addition amount is within the same range as described above. In rinsing processing, a resin polisher is physically slid on the surface of the raw glass plate while supplying a processing liquid to which aluminum sulfate has been added between the raw glass plate and the resin polisher, and therefore, it is possible to efficiently remove the colloidal silica abrasive particles used in the preceding polishing step from the surface of the raw glass plate. That is, in this embodiment, an effect of removing colloidal silica abrasive particles is enhanced by adding aluminum sulfate at the time of the polishing processing.

It is preferable to set the supply rate of the polishing liquid to at least 500 to 5000 ml/minute from the viewpoint of balancing cost against preventing reattachment of the abrasive particles to the raw glass plate. Moreover, it is preferable to set the load applied to the raw glass plate to within a range of 10 to 100 $g/cm^2$. If the load is smaller than this range, an effect of removing the abrasive particles may be insufficiently obtained, and if the load is larger than this range, minute scratches may be formed on the surface of the raw glass plate.

It should be noted that it is preferable to start the rinsing step without stopping the rotation of the polishing surface plates after the polishing step using colloidal silica is finished. This makes it possible to prevent the colloidal silica abrasive particles from sticking to the surface of the raw glass plate and to enhance the effect of the subsequent rinsing processing.

Since the colloidal silica attaching to the surface of the raw glass plate due to the polishing processing can be removed by the rinsing processing, it is possible to reduce the processing load in a subsequent cleaning step. For example, the pH of an alkaline cleaning liquid can be reduced to 10 or less, excessive etching due to a high pH does not occur, and thus it is possible to suppress an increase in surface roughness. As a result of the examination of the inventors of the present invention, it was revealed that one of the factors that conventionally increase the surface roughness Ra of the raw glass plate for a wavelength band of 10 to 50 nm is an etching caused by the alkaline cleaning liquid after polishing. With this embodiment, it is possible to suppress this etching effect, and therefore, it is possible to more effectively reduce the surface roughness Ra of the raw glass plate for a wavelength band of 10 to 50 nm.

The raw glass plate on which the rinsing step has been performed is immersed in a cleaning bath, subjected to ultrasonic cleaning, and then dried, and thus a magnetic-disk glass substrate is obtained. It should be noted that if the glass substrate is cleaned using an acidic cleaning liquid, the main surface becomes rough and the variation of inclinations on the main surface increases, and therefore, it is preferable to use a neutral cleaning liquid or an alkaline cleaning liquid.

A main surface that has surface properties in which the arithmetic mean roughness (Ra) for wavelength components of 10 to 50 nm is 0.15 nm or less can be obtained through the polishing of this step, the rinsing step, and the cleaning. Also, a main surface that has surface properties in which the arithmetic mean roughness (Ra) for wavelength components of 10 to 30 nm or 10 to 20 nm is 0.10 nm or less can be obtained.

It should be noted that it is possible to also adjust the arithmetic mean roughness (Ra) for the above-described wavelength components of the main surface by the processing time of the polishing, rinsing, and cleaning in addition to the above-described methods.

The method for manufacturing a magnetic-disk glass substrate of this embodiment has been described above for each step, but the order of the steps is not limited to the above-described order. Moreover, the chemical strengthening step may be omitted depending on an application or a glass composition of the magnetic-disk glass substrate.

It should be noted that crystallized glass may be used for the magnetic-disk glass substrate of this embodiment.

In the case where crystallized glass is formed by crystallizaton processing, it is sufficient to perform the following processing. Specifically, for example, a plurality of glass substrates sandwiching a disc-shaped plate called a setter between each of them are introduced into a heating furnace and subjected to heating processing. The setters can be made of ceramics. In the heating processing, the glass substrate is crystallized by, for example, being held at a nucleus forming temperature for a predetermined period of time and then being held at a crystal growing temperature for a predetermined period of time. The temperature and the period of time for nucleus formation and crystal growth are set as appropriate depending on the glass composition of the glass substrate. When the glass substrate is cooled after being heated, it is preferable to adjust a cooling speed during slow cooling such that distortion and bending do not occur in the glass substrate.

It is possible to determine whether or not the glass substrate subjected to the crystallization processing is crystallized using, for example, a diffraction intensity distribution obtained by powder X-ray diffractometry. It should be noted that it is preferable to precipitate crystals whose average crystalline particle size in the crystal phase is 10 nm or less for the purpose of reducing the surface roughness of the main surface of the glass substrate.

Glass that has been crystallized (referred to as "crystallized glass" hereinafter) is a material configured to have crystals precipitated inside the glass by heating amorphous glass, and can be distinguished from amorphous glass.

In this embodiment, the Young's modulus of the glass substrate on which the crystallization processing has been performed is preferably 100 GPa or more, and more preferably 120 GPa or more. Thus, it is possible to obtain a glass substrate with high flexural strength and high impact resistance. The flexural strength of the glass substrate on which the crystallization processing has been performed is preferably 7 kgf or more, and particularly preferably 8 kgf or more for the purpose of enhancing the impact resistance. Thus, it is possible to obtain a magnetic-disk glass substrate that is preferably for a hard disk drive (HDD) with a high rotation speed of 10000 rpm or more.

[Magnetic Disk]

A magnetic disk is a magnetic recording medium having a magnetic recording layer on the magnetic-disk glass substrate of this embodiment.

The magnetic disk has a configuration in which, for example, at least an adherent layer, a base layer, a magnetic recording layer, a protecting layer and a lubricant layer are laminated on the main surface of the magnetic-disk glass substrate (referred to as "substrate" as appropriate hereinafter) in this order from the side of the main surface.

For example, the substrate is introduced into a film deposition device that has been evacuated and the layers from the adherent layer to the magnetic recording layer are sequentially formed on the main surface of the substrate in an Ar atmosphere by a DC magnetron sputtering method. CrTi can be used in the adherent layer, Ru can be used in the base layer, and a CoCrPt based alloy can be used in the magnetic recording layer, for example. After the film deposition as described above, by forming the protecting layer using $C_2H_4$ by, for example, a CVD method and performing nitriding processing that introduces nitrogen to the surface in the same chamber, a magnetic recording medium can be formed. Thereafter, by coating the protecting layer with perfluoropolyether (PFPE) by a dip coat method, the lubricant layer can be formed.

In addition, a soft under layer (SUL), a seed layer, and the like may be formed between the adherent layer and the magnetic recording layer by a known film deposition method such as a sputtering method (including a DC magnetron sputtering method, RF magnetron sputtering method, and the like) or a vapor deposition method. It is possible to refer to, for example, JP 2009-110626A, paragraphs [0027] to [0032] for detailed description on the above-described layers.

It is thought that it is preferable to use a high Ku magnetic material to form a magnetic recording layer in a magnetic disk for energy-assisted magnetic recording. For example, the magnetic recording layer can be made of an L10 ordered alloy including a magnetic material containing an alloy of Pt, and Fe and/or Co as a main component. In order to obtain such a magnetic recording layer, the magnetic material containing an alloy of Pt, and Fe and/or Co as a main component is deposited on the main surface of the substrate, and then annealing processing for ordering the layer is performed. Here, the above annealing processing is generally performed at a high temperature of higher than 500° C. Accordingly, if glass constituting the substrate has poor heat resistance, the glass is deformed at a high temperature and flatness is impaired. In contrast, the substrate having the above-described composition exhibits superior heat resistance (glass-transition temperature of 650° C. or higher), and therefore, high flatness can be retained after the annealing processing.

Working Examples and Comparative Examples

In order to confirm the effect of the method for manufacturing a magnetic-disk glass substrate according to this embodiment, a 2.5-inch magnetic-disk glass substrate was produced from glass having the above-described Glass Composition 1, and a magnetic disk was produced.

Production of Magnetic-Disk Glass Substrate of Working Examples and Comparative Examples The steps of the method for manufacturing a magnetic-disk glass substrate according to this embodiment were performed in a given order.

Here, the pressing method was used in molding of the raw glass plates in step (1). After forming a circular hole, rough grinding was performed on the main surface using loose abrasive particles.

In the circular hole forming step in step (2), a circular hole was formed in the center of the raw glass plate using a cylindrical drill.

In the chamfering in step (3), rough grinding for forming chamfered surfaces was performed using a rough-grit diamond grindstone, and then final grinding was performed on the chamfered surfaces using a fine-grit diamond grindstone.

In the end surface polishing in step (4), cerium oxide was used as the loose abrasive particles, and polishing was performed using a polishing brush.

In the grinding using fixed abrasive particles in step (5), grinding was performed using a grinding device in which a grindstone having fixed abrasive particles obtained by fixing diamond abrasive particles with a resin were attached to a surface plate.

In the first polishing in step (6), polishing was performed using the polishing device shown in FIGS. 2 and 3. A polishing liquid containing cerium oxide abrasive particles having an average particle diameter of 1 μm as a polishing material was used, and a hard urethane pad was used as the polishing pad.

In the chemical strengthening in step (7), a mixed liquid of melts of potassium nitrate and sodium nitrate was used as a chemical strengthening liquid, and the raw glass plate was immersed in the chemical strengthening liquid.

In the second polishing in step (8), polishing was performed using another polishing device similar to the polishing device shown in FIGS. 2 and 3. A polishing pad with a soft polisher (suede) (polyurethane foam with an Asker C hardness of 75) was used. A polishing liquid was used that was obtained by dispersing colloidal silica (average particle diameter (D50): 30 nm) in water and adding and dissolving aluminum sulfate in an amount of 0.01 mol/L therein. A load of 100 g/cm$_2$ was applied, and the machining allowance was 5 μm.

Subsequently, the rinsing step was performed using the same polishing device as is. The rotation of the surface plate of the polishing device was not stopped when transitioning from the polishing processing to the rinsing processing. In the rinsing step, water in which aluminum sulfate was added and dissolved in an amount of 0.01 mol/L was used as a processing liquid to be supplied between the polishing pad and the glass substrate. A load of 100 g/cm$^2$ was applied, and the processing time was set to 5 minutes.

The glass substrate on which the above-described rinsing step had been performed was immersed in respective cleaning baths filled with a neutral detergent, an alkaline cleaning liquid (pH: 10 or less), pure water, and IPA so as to be subjected to ultrasonic cleaning, and then was dried with IPA (steam drying). Thus, a magnetic-disk glass substrate was obtained. The produced magnetic-disk glass substrate was used as a substrate for a magnetic disk having a nominal diameter of 2.5 inches (having an inner diameter of 20 mm, an outer diameter of 65 mm, and a thickness of 0.635 mm).

The arithmetic mean roughness Ra for a specific wavelength component of the main surface was adjusted by the polishing time and cleaning time in the second polishing, and thus the magnetic-disk glass substrates of working examples and comparative examples shown in Table 1 were obtained. In this case, the arithmetic mean roughness Ra for each wavelength component of the main surface was calculated as follows. First, an area of 1 μm square on the main surface of the magnetic-disk glass substrate was divided into sections of 512 by 512, and three-dimensional data of surface properties was measured using an AFM. Two-dimensional Fourier transformation was performed on the measured three-dimensional data to provide a two-dimensional image. A specific wavelength component was extracted from the provided two-dimensional image, and inverse Fourier transformation was performed on the two-dimensional image of the extracted desired wavelength component to produce three-dimensional data (three-dimensional data including only the specific wavelength component), and an arithmetic mean roughness Ra was calculated from this three-dimensional data.

It should be noted that each of the magnetic-disk glass substrates of working examples 1 to 4 had a main surface having an arithmetic mean roughness Ra for all of the wavelength bands of 0.15 nm or less.

Production of Magnetic Disks of Working Examples and Comparative Examples

Next, magnetic-disks were produced using the magnetic-disk glass substrates of the working examples and comparative examples.

It should be noted that film deposition was performed on the magnetic-disk glass substrate as follows. First, an adherent layer/SUL/pre-base layer/base layer/magnetic recording layer/auxiliary recording layer/protecting layer/lubricant layer were sequentially formed on the substrate in an Ar atmosphere by a DC magnetron sputtering method using a film deposition device that had been evacuated. It should be noted that the film deposition was performed at an Ar gas pressure of 0.6 Pa unless otherwise stated. As the adherent layer, a Cr-50Ti layer with a thickness of 4 nm was formed. As the SUL, a Ru layer with a thickness of 0.7 nm and 92Co-3Ta—Zr layers with a thickness of 10 nm that sandwiched the Ru layer were formed. As the pre-base layer, a Ni-10 W layer with a thickness of 8 nm was formed. As the base layer, a Ru layer with a thickness of 10 nm was formed at 0.6 Pa and then a Ru layer with a thickness of 10 nm was formed thereon at 5 Pa. As the magnetic recording layer, a 90(72Co-10Cr-18Pt)-5($SiO_2$)-5($TiO_2$) layer with a thickness of 15 nm was formed at 3 Pa. As the auxiliary recording layer, a 62Co-18Cr-15Pt-5B layer with a thickness of 6 nm was formed. As the protecting layer, a layer with a thickness of 4 nm was formed using $C_2H_4$ by a CVD method, and the surface layer was subjected to nitriding processing. As the lubricant layer, a layer with a thickness of 1 nm was formed using perfluoropolyether (PFPE) by a dip coat method.

Magnetic disks corresponding to the respective magnetic-disk glass substrates of the comparative examples and working examples were obtained through the above-described manufacturing steps.

When the particle size (diameter) of a magnetic particle in the magnetic recording layer was examined by a plane observation using a TEM, the average value was 8 nm. Moreover, when a film-formation state was checked by a cross-sectional observation using a TEM, the CrTi layer and SUL were in the amorphous state and the particle boundaries were not observed, whereas the particle boundaries were observed in the NiW layer to the auxiliary recording layer and it was observed that crystals grew to have a columnar shape.

[Evaluation of Magnetic Disks of Working Examples and Comparative Examples]

The signal-to-noise ratio (SNR) of reproduced signals from each produced magnetic disk was measured under the following conditions. It should be noted that a DFH mechanism-mounting head was used. A distance from the front end of a recording and reproducing element portion to the surface of the magnetic disk was set to be 2 nm by a DFH mechanism. The SNR determined by this measurement is also referred to as "SNR1".

Linear recording density during writing signals: 2000 kbpi
Rotation speed of magnetic disk: 5400 rpm The SNR, referred to as "SNR2", measured in the same manner as described above except for the following conditions was additionally evaluated.

Linear recording density during writing signals: 2200 kbpi
Rotation speed of magnetic disk: 7200 rpm Table 1 shows the arithmetic mean roughnesses (Ra) for wavelength components of 10 to 50 nm of the main surfaces of magnetic-disk glass substrates produced as described above, and the evaluation results of the SNR1 and SNR2 of reproduced signals from magnetic disks corresponding to the respective glass substrates. The evaluation results of the SNR1 and SNR2 were divided into four levels, Levels 1 to 4, in descending order of favorability of SNR (that is, in descending order of SNR) when the SNR1 and SNR2 of comparative example 1 were given as Refs (references). Levels 1 to 3 are acceptable. It should be noted that this evaluation criterion was applied to all of the working examples and comparative examples, which will be described later.

[Evaluation Criterion of SNR1 and SNR2]
Level 1: Ref+0.5 [dB]≤SNR
Level 2: Ref+0.3 [dB]≤SNR<Ref+0.5 [dB]
Level 3: Ref<SNR<Ref+0.3 [dB]
Level 4: less than or equal to Ref As shown in Table 1, it was confirmed that by setting the arithmetic mean roughness (Ra) for wavelength components of 10 to 50 nm of the main surface of the magnetic-disk glass substrate to 0.15 nm or less, the SNR1 of reproduced signals from each magnetic disk of working examples 1 to 4 was improved compared with those of comparative examples 1 and 2. It is thought that this is because the surface roughness for wavelength components (10 to 50 nm) that was highly correlated with the crystalline orientation dispersion Δθ50 of the magnetic particles was reduced regarding the main surface of the magnetic-disk glass substrate of each working example, and therefore the crystalline orientation dispersion Δθ50 came close to zero, thus making it possible to obtain a favorable SNR.

Moreover, it was found that regarding the SNR2, by setting the arithmetic mean roughness (Ra) for wavelength components of 10 to 50 nm of the main surface of the magnetic-disk glass substrate to 0.15 nm or less, the SNR was significantly improved in a high-frequency region that was even higher than 2000 kbpi.

TABLE 1

|  | Ra for 10 to 50 nm (nm) | SNR1 | SNR2 |
| --- | --- | --- | --- |
| Comp. Ex. 1 | 0.21 | Level 4 (Ref) | Level 4 (ref) |
| Comp. Ex. 2 | 0.17 | Level 4 | Level 4 |
| Work. Ex. 1 | 0.15 | Level 3 | Level 2 |
| Work. Ex. 2 | 0.13 | Level 3 | Level 2 |
| Work. Ex. 3 | 0.10 | Level 3 | Level 2 |
| Work. Ex. 4 | 0.08 | Level 3 | Level 2 |

Next, the magnetic-disk glass substrates and magnetic disks of working examples 5 to 8 were produced under the same conditions of working example 1, except that the diameter of silica abrasive particles used in the second polishing was changed to 20 nm and the polishing time and rinsing time were sequentially extended.

Table 2 shows the arithmetic mean roughnesses (Ra) for wavelength components of 10 to 30 nm of the main surfaces of magnetic-disk glass substrates produced in this manner, and the evaluation results of the SNR1 of reproduced signals from magnetic disks corresponding to the respective glass substrates. As shown in table 2, it was confirmed that by setting the arithmetic mean roughness (Ra) for wavelength components of 10 to 30 nm of the main surface of the magnetic-disk glass substrate to 0.10 nm or less, the SNR1 of reproduced signals from each magnetic disk of working examples 6 to 8 was further improved compared with those of working examples 1 to 4.

TABLE 2

|  | Ra for 10 to 30 nm (nm) | SNR1 |
| --- | --- | --- |
| Work. Ex. 5 | 0.12 | Level 3 |
| Work. Ex. 6 | 0.10 | Level 2 |
| Work. Ex. 7 | 0.08 | Level 2 |
| Work. Ex. 8 | 0.06 | Level 2 |

Next, the magnetic-disk glass substrates and magnetic disks of working examples 9 to 12 were produced under the same conditions of working example 1, except that the diameter of silica abrasive particles to be used in the second polishing was changed to 15 nm and the polishing time and rinsing time were sequentially extended.

Table 3 shows the arithmetic mean roughnesses (Ra) for wavelength components of 10 to 20 nm of the main surfaces of magnetic-disk glass substrates produced in this manner, and the evaluation results of the SNR1 of reproduced signals from magnetic disks corresponding to the respective glass substrates. As shown in table 3, it was confirmed that by setting the arithmetic mean roughness (Ra) for wavelength components of 10 to 20 nm of the main surface of the magnetic-disk glass substrate to 0.10 nm or less, the SNR of reproduced signals from each magnetic disk of working examples 10 to 12 was further improved compared with those of Working Examples 6 to 8.

Although the reason why the most favorable SNR1 of reproduced signals from the magnetic signals can be obtained by setting Ra for wavelength components of 10 to 20 nm of the main surface of the magnetic-disk glass substrate to 0.10 nm or less is not necessarily clear, it is thought that this is because half of the wavelength band is close to the size of the magnetic particles (8 nm). That is, it is inferred that in the case where both values are close to each other, the magnetic particles are often arranged coinciding with the period of unevenness of the main surface of the magnetic disk, and thus the variation of the crystalline orientation of the magnetic particles is reduced (that is, Δθ50 is reduced).

TABLE 3

| | Ra for 10 to 30 nm (nm) | SNR1 |
|---|---|---|
| Work. Ex. 9 | 0.12 | Level 3 |
| Work. Ex. 10 | 0.10 | Level 1 |
| Work. Ex. 11 | 0.08 | Level 1 |
| Work. Ex. 12 | 0.06 | Level 1 |

Next, magnetic-glass substrates in which the above-described "frequency at which the square value of the inclinations is 0.004 or more" was changed were produced based on the manufacturing conditions of working example 1 (working examples 13 to 16 shown in Table 4), and the SNR of reproduced signals from each magnetic disk produced using the glass substrates was measured under the following conditions. In this case, the same conditions as those of the above-described SNR1 were applied, except that a distance from the front end of the recording and reproducing element portion to the surface of the magnetic disk was set to be 1 nm. The SNR determined by this measurement is referred to as "SNR3".

Each produced magnetic-disk glass substrate had a mean square value of the inclinations of 0.0025 or less. Moreover, Ra for a wavelength band of 10 to 50 nm of each magnetic-disk glass substrate was within a range of 0.13 to 0.15 nm, and substantially the same value.

The evaluation results of the SNR3 were divided into four levels, Levels 1 to 4, in descending order of favorability of SNR (that is, in descending order of SNR) when the SNR of working example 13 was given as Ref (reference).

[Evaluation Criterion of SNR3]
Level 1: Ref+0.5 [dB]≤SNR3
Level 2: Ref+0.3 [dB]≤SNR3<Ref+0.5 [dB]
Level 3: Ref<SNR3<Ref+0.3 [dB]
Level 4: less than or equal to Ref As shown in Table 4, it was revealed that by setting the frequency at which the square value of the inclinations on the main surface of the magnetic-disk glass substrate was 0.004 or more to 15% or less, the SNR was greatly improved in the case where the sensitivity of the magnetic head was further enhanced.

TABLE 4

| | Frequency at which square value of inclinations is 0.004 or more (%) | SNR3 |
|---|---|---|
| Work. Ex. 13 | 17 | Level 4 (Ref) |
| Work. Ex. 14 | 15 | Level 2 |
| Work. Ex. 15 | 13 | Level 2 |
| Work. Ex. 16 | 10 | Level 2 |

[Evaluation with Different Glass Composition]

Next, in order to further confirm the effect of the method for manufacturing a magnetic-disk glass substrate according to this embodiment, the magnetic-disk glass substrates and magnetic disks were produced in the same manner as in working examples 1, 6 and 10 in principle, except that glass having the above-described glass composition 2 was used. Also, the magnetic-disk glass substrates and magnetic disks were produced using glass having glass composition 3 in the same manner. It should be noted that the manufacturing conditions were adjusted as appropriate.

As a result, in the case where either glass composition was applied, the surface roughness of the magnetic-disk glass substrate was correlated with the SNR of reproduced signals from the magnetic disk corresponding to the glass substrate in the same manner as in working examples 1, 6 and 10.

While the magnetic-disk glass substrate and magnetic disk according to the present invention has been described in detail, the present invention is not limited to the above-described embodiment, and it will be appreciated that various improvements and modifications can be made without departing from the concept of the present invention.

The invention claimed is:

1. A magnetic-disk glass substrate for use as a magnetic disk, the magnetic-disk glass substrate comprising:
    a pair of main surfaces,
    an arithmetic mean roughness for wavelength components of 10 to 50 nm of a surface of the main surfaces being 0.15 nm or less when an area of 1 μm square is divided into sections of 512 by 512 and each section is measured using an atomic force microscope,
    there is no texture in a circumferential direction on the main surfaces, and
    the magnetic disk having a linear recording density of at least 2000 kbpi.

2. A magnetic disk in which at least a magnetic recording layer is formed on a surface of the magnetic-disk glass substrate according to claim 1.

3. The magnetic-disk glass substrate according to claim 1, wherein
    in addition to the arithmetic mean roughness for wavelength components of 10 to 50 nm of the surface of the main surfaces being 0.15 nm or less, the arithmetic mean roughness of the surface of the main surfaces is 0.15 nm or less when a wavelength band is not specified.

4. A magnetic disk in which at least a magnetic recording layer is formed on a surface of the magnetic-disk glass substrate according to claim 3.

5. A magnetic-disk glass substrate for use as a magnetic disk, the magnetic-disk glass substrate comprising:
    a pair of main surfaces,
    an arithmetic mean roughness for wavelength components of 10 to 30 nm of a surface of the main surfaces being 0.12 nm or less when an area of 1 μm square is divided into sections of 512 by 512 and each section is measured using an atomic force microscope,
    there is no texture in a circumferential direction on the main surfaces, and
    the magnetic disk having a linear recording density of at least 2000 kbpi.

6. A magnetic disk in which at least a magnetic recording layer is formed on a surface of the magnetic-disk glass substrate according to claim 5.

7. The magnetic-disk glass substrate according to claim 5, wherein
    in addition to the arithmetic mean roughness for wavelength components of 10 to 30 nm of the surface of the main surfaces being 0.12 nm or less, the arithmetic mean roughness of the surface of the main surfaces is 0.15 nm or less when a wavelength band is not specified.

8. A magnetic disk in which at least a magnetic recording layer is formed on a surface of the magnetic-disk glass substrate according to claim 7.

9. A magnetic-disk glass substrate for use as a magnetic disk, the magnetic-disk glass substrate comprising:
    a pair of main surfaces, an arithmetic mean roughness of a surface of the main surfaces when an area of 1 μm square is divided into sections of 512 by 512 and each section is measured using an atomic force microscope being 0.15 nm or less when a wavelength band is not specified, the arithmetic mean roughness of the surface of the main surfaces when wavelength components of 10 to 20 nm are extracted being 0.10 nm or less, there is no texture in a circumferential direction on the main surfaces, and the magnetic disk having a linear recording density of at least 2000 kbpi.

10. A magnetic disk in which at least a magnetic recording layer is formed on a surface of the magnetic-disk glass substrate according to claim 9.

* * * * *